United States Patent
Becker

(10) Patent No.: US 12,072,366 B2
(45) Date of Patent: Aug. 27, 2024

(54) METHOD AND ELECTRIC CIRCUIT ARRANGEMENT FOR DETERMINING A BRANCH INSULATION RESISTANCE AND A BRANCH LEAKAGE CAPACITANCE IN AN UNGROUNDED POWER SUPPLY SYSTEM

(71) Applicant: Bender GmbH & Co. KG, Gruenberg (DE)

(72) Inventor: Pascal Becker, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 18/220,009

(22) Filed: Jul. 10, 2023

(65) Prior Publication Data

US 2024/0012042 A1    Jan. 11, 2024

(30) Foreign Application Priority Data

Jul. 11, 2022    (DE) ...................... 10 2022 117 233.3

(51) Int. Cl.
*G01R 31/08*    (2020.01)
*G01R 15/18*    (2006.01)
(Continued)

(52) U.S. Cl.
CPC ........... *G01R 31/086* (2013.01); *G01R 15/18* (2013.01); *G01R 23/00* (2013.01); *G01R 27/025* (2013.01);
(Continued)

(58) Field of Classification Search
CPC ...... G01R 27/08; G01R 31/086; G01R 27/18; G01R 27/2605; G01R 15/18; G01R 23/00; G01R 27/025
See application file for complete search history.

(56) References Cited

U.S. PATENT DOCUMENTS

| | | | |
|---|---|---|---|
| 5,365,179 A | 11/1994 | Rogers | |
| 10,598,718 B2 * | 3/2020 | Hackl | .................. G01R 31/088 |
| 11,391,785 B2 * | 7/2022 | Hackl | ..................... G01R 27/18 |

FOREIGN PATENT DOCUMENTS

| | | |
|---|---|---|
| DE | 102011108716 A1 | 2/2012 |
| DE | 102012218107 A1 | 4/2014 |

(Continued)

*Primary Examiner* — Amy He
(74) *Attorney, Agent, or Firm* — Dickinson Wright PLLC; Andrew D. Dorisio

(57) ABSTRACT

A method and an electric circuit arrangement for determining a branch insulation resistance and a branch leakage capacitance of a line branch to be monitored in a branched, ungrounded power supply system having active conductors and a measuring voltage fed centrally by a controllable measuring voltage source and a residual current caused by the measuring voltage being registered using a current sensor in the line branch to be monitored. The centrally supplied measuring voltage is formed over a generator period having a characteristic signal form defined via the frequency composition. By this (frequency) modulation of the measuring voltage, information is transmitted from the central feed location of the measuring voltage to the current sensor disposed in the line branch to be monitored. Based on this information, the current sensor can establish with which resistance value the coupling circuit feeds the measuring voltage in the corresponding generator period, without another communication channel being required.

10 Claims, 3 Drawing Sheets

(51) Int. Cl.
  *G01R 23/00* (2006.01)
  *G01R 27/02* (2006.01)
  *G01R 27/08* (2006.01)
  *G01R 27/18* (2006.01)
  *G01R 27/26* (2006.01)
(52) U.S. Cl.
  CPC ............ *G01R 27/08* (2013.01); *G01R 27/18* (2013.01); *G01R 27/2605* (2013.01)

(56) References Cited

FOREIGN PATENT DOCUMENTS

| | | |
|---|---|---|
| DE | 102013218836 A1 | 3/2015 |
| DE | 102014223287 A1 | 5/2016 |
| DE | 102017217473 B3 | 1/2019 |
| DE | 102018125004 B3 | 12/2019 |
| EP | 0593007 A2 | 4/1994 |

\* cited by examiner

METHOD AND ELECTRIC CIRCUIT ARRANGEMENT FOR DETERMINING A BRANCH INSULATION RESISTANCE AND A BRANCH LEAKAGE CAPACITANCE IN AN UNGROUNDED POWER SUPPLY SYSTEM

This application claims priority to German Patent Application No. 10 2022 117 233.3 filed on Jul. 11, 2022, the disclosure of which is incorporated herein by reference.

TECHNICAL FIELD

The invention relates to a method and an electric circuit arrangement for determining a branch insulation resistance and a branch leakage capacitance of a line branch to be monitored in a branched, ungrounded power supply system having active conductors by generating a measuring voltage by means of a controllable measuring voltage source, by feeding the measuring voltage to a central location of the power supply system by means of a coupling circuit in each of the active conductors and by registering a residual current caused by the measuring voltage in the line branch to be monitored by means of current sensor.

BACKGROUND

For increased requirements to operational, fire and touch safety of electric installations, the network configuration of an ungrounded power supply system is used, which is also referred to as an insulation network (French: isolé terre—IT) or as an IT (power supply) system. In this type of power supply system, the active parts are separate from the ground potential—to ground. The advantage of these networks lies in the function of the connected electric consumers not being impaired when an insulation fault, such as a ground fault or a touch fault, occurs, as a current circuit cannot close because of the ideally infinitely large impedance value between an active conductor of the network and ground.

This inherent safety of the ungrounded power supply system can thus ensure a continuous power supply of the consumers fed by the ungrounded power supply system even when a first insulation fault occurs.

The resistance of the ungrounded power supply system to ground (insulation resistance—in the event of a fault also an insulation fault resistance or fault resistance) is therefore monitored continuously, as a fault loop would arise via a possible other fault at another active conductor and the flowing fault current in conjunction with an overcurrent protective device would cause the installation to be shut off, leading to an operational standstill.

Provided that the insulation state of the ungrounded power supply system is continuously monitored by an insulation monitoring device, operation of the ungrounded power supply system can be continued without stipulated time constraints even when a first fault has occurred.

To monitor the insulation resistance, insulation monitoring devices are used. Insulation monitoring devices known from the state of the art according to product standard IEC 61557-8 determine the (total) insulation resistance of the entire IT system to ground. The insulation monitoring device is connected between the active conductors on the one hand and ground on the other hand and superimposes a measuring signal on the network. When an insulation fault arises, the measuring circuit closes between network and ground via the insulation fault, meaning a measuring current according to the insulation fault becomes set. This measuring current causes a corresponding voltage drop at a measured resistance in the insulation monitoring device, the voltage drop being evaluated by the electronics and causing an alarm notification to be dispatched when a preset threshold has been exceeded.

Insulation monitoring devices configured according to standard take into account ohmic leakages distributed symmetrically on all active conductors as insulation faults as well as asymmetric insulation faults, such as those arising at an individual active conductor.

Besides being able to determine the insulation resistance, insulation monitoring devices available on the market are additionally able to determine the (total) (network) leakage capacitance of the ungrounded power supply system to ground. Analogously to the insulation resistance which represents the ohmic portion of the leakage impedance, the leakage capacitance represents the capacitive portion of the leakage to ground. The (total) leakage capacitance is the sum of all leakage capacitances in the entire IT system to ground.

Typically therefore, the determination of the insulation resistance and, if applicable, of the leakage capacitance is executed using a centrally disposed insulation monitoring device and refers to the entire ungrounded power supply system.

In order to be able to make differentiated claims regarding the insulation state of the branched, ungrounded power supply system and to be able to more quickly locate insulation faults, if required, the selective acquisition of information on the branch insulation resistance effective in a line branch and/or on the branch leakage capacitance is desirable for this specific line branch (line outlet) of the power supply system.

Different solutions are known from the state of the art for detecting a partial insulation resistance and a partial leakage capacitance.

DE10 2017 217 473 B3 discloses a method which presumes a continuous, metrological determination of the total insulation resistance and the total network leakage capacitance via a centrally disposed, enhanced insulation monitoring device in order to determine a partial insulation resistance and a partial network leakage capacitance.

In the electric protective device disclosed in DE10 2014 223 287 A1, a second fault can be selectively identified in a line branch; however, this requires a communication channel between the feed location and the measuring current transformer disposed in the line branch to be monitored.

Another option for monitoring a subsystem insulation resistance is disclosed in DE10 2013 218 836 A1; however a measuring current is not supplied centrally, a measuring current limited to the corresponding line branch instead flowing peripherally.

Consequently, the following requirements to a branch-selective R/C determination are derived from the previously mentioned solutions known from the state of the art, the execution of the determination often requiring technically complicated measures, such as a) communication of detected parameters from other line branches or the central measuring device;
b) voltage measurement either centrally, connected to a communication, or peripherally in each line branch;
c) configuration of the entire network topology in the evaluation devices.

In particular the option of communication between a centrally supplying measuring device and the line branch to be monitored is often tied to considerable efforts regarding circuitry.

SUMMARY

The object of the invention at hand is therefore to indicate a method and an electric circuit arrangement for determining the branch insulation resistance and the branch leakage capacitance of a line branch in a branched, ungrounded power supply system, the electric circuit arrangement not being dependent on a continuous communication connection between the central measuring-voltage feed and a current sensor disposed in the line branch to be monitored.

The invention at hand is based on the fundamental idea of forming the generated and centrally fed measuring voltage having a characteristic signal form defined by the frequency composition over a generator period, the possible signal forms being known to the peripherally disposed current sensor and being interpreted by it.

Based on this (frequency) modulation of the measuring voltage, information is transmitted from the central feed location of the measuring voltage to the current sensor disposed in the line branch to be monitored. On account of this information, the current sensor can detect with which resistance value the coupling circuit feeds the measuring voltage in the corresponding generator period, without another communication channel being required.

The current sensor disposes over all information in conjunction with the registration of the residual current caused by the measuring voltage and the data stored in the current sensor in order to compute the branch insulation resistance and the branch leakage capacitance.

The measuring voltage is formed alternatingly each via a generator period from a first frequency composition and a second frequency composition.

The first frequency composition is fed (during a generator period) via a first coupling resistance by means of a coupling circuit switchable using a switch unit, and the second frequency composition is fed (in the subsequent generator period) via a second coupling resistance. The two frequency compositions are fed alternatingly a generator period each.

The measuring voltage is fed with the signal form of the first frequency composition and consequently the registration of the residual current caused thereby and registered by the current collector is tied to the application of the first coupling resistance, the feeding of the second frequency composition accordingly being tied to the application of the second coupling resistance.

In a data storage of the current sensor, the value of the first coupling resistance and the value of the second coupling resistance and the spectral composition of the first frequency composition and the spectral composition of the second frequency composition are stored. Owing to this configuration of the current sensor, the current sensor is also familiar with the amplitudes of the voltage portions, which form the measuring voltage, in addition to the two coupling resistances.

In a computing unit, the current sensor executes a frequency analysis of the residual current over two subsequent generator periods in order to identify which (of the two) frequency composition(s) is presently being fed.

The presently switched coupling resistance is determined from the assignment of the identified frequency composition known by the current sensor to the corresponding coupling resistance.

Thereafter, the branch insulation resistance and the branch leakage capacitance are computed in the computing unit from the measured residual current, the measuring voltage, the frequency contained in the (first and second) frequency composition and the (first and second) coupling resistance.

Based on the variables effective in two subsequent generator periods and known by measurement and configuration, a system of equations can be established from which the branch insulation resistance and the branch leakage capacitance are established as the wanted variables.

According to the invention, all information from which the branch insulation resistance and the branch leakage capacitance can be computed independently of the remaining network components is consequently available to the computing the unit.

In conjunction with a central feeding of the measuring voltage, the branch insulation resistance and the branch leakage capacitance are determined by the frequency formation of the measuring voltage according to the invention and the configured current sensor according to the invention without any other communicative connection or data connection to a centrally disposed insulation monitoring device or centrally disposed test generator (of an insulation fault location device).

In another embodiment, the first frequency composition and the second frequency composition each contain at least two frequencies (frequency portions), the first frequency composition differing from the second frequency portion in at least one frequency.

The first frequency composition has to differ from the second frequency composition in at least one frequency so that an unambiguous assignment to the corresponding, presently switched coupling resistance is provided. On the other hand, a sufficient number of equations has to be available to solve the system of equations determining the branch insulation resistance and the branch leakage capacitance. This is provided when both the first frequency composition and the second frequency composition each consist of at least two frequencies for forming and alternatingly feeding the measuring voltage.

In order to increase the robustness against disturbing effects, it is also possible to compose the frequency composition of more than two frequencies.

Furthermore, the frequencies contained in the frequency compositions are chosen such that their periods are contained as integral multiples in the generator period.

Preferably, the measuring voltage is a measuring pulse voltage of an insulation monitoring device or a test voltage of an insulation fault location device.

In combination with a central insulation monitoring device or an insulation fault location device, the measuring voltage can be formed such by composing the frequency composition that this measuring voltage fulfils requirements to a measuring signal to be generated by the insulation monitoring device and thus a continuous measurement of the branch insulation resistance and the branch leakage capacitance is possible during the insulation monitoring of the total network or while locating insulation faults.

In an advantageous manner, the residual current is registered by means of a current sensor configured as a measuring current transformer.

The claimed structural features of the electric circuit arrangement according to the invention lead to the corresponding method steps of the method according to the invention for determining the branch insulation monitoring resistance and the branch leakage capacitance.

Consequently, the technical effects attained using the method and the advantages resulting therefrom apply equally to the electric circuit arrangement.

BRIEF DESCRIPTION OF DRAWINGS

Further advantageous embodiments are derived from the following description and the drawings, which describe a preferred embodiment of the invention in further detail by means of examples.

DETAILED DESCRIPTION

Figure 1:
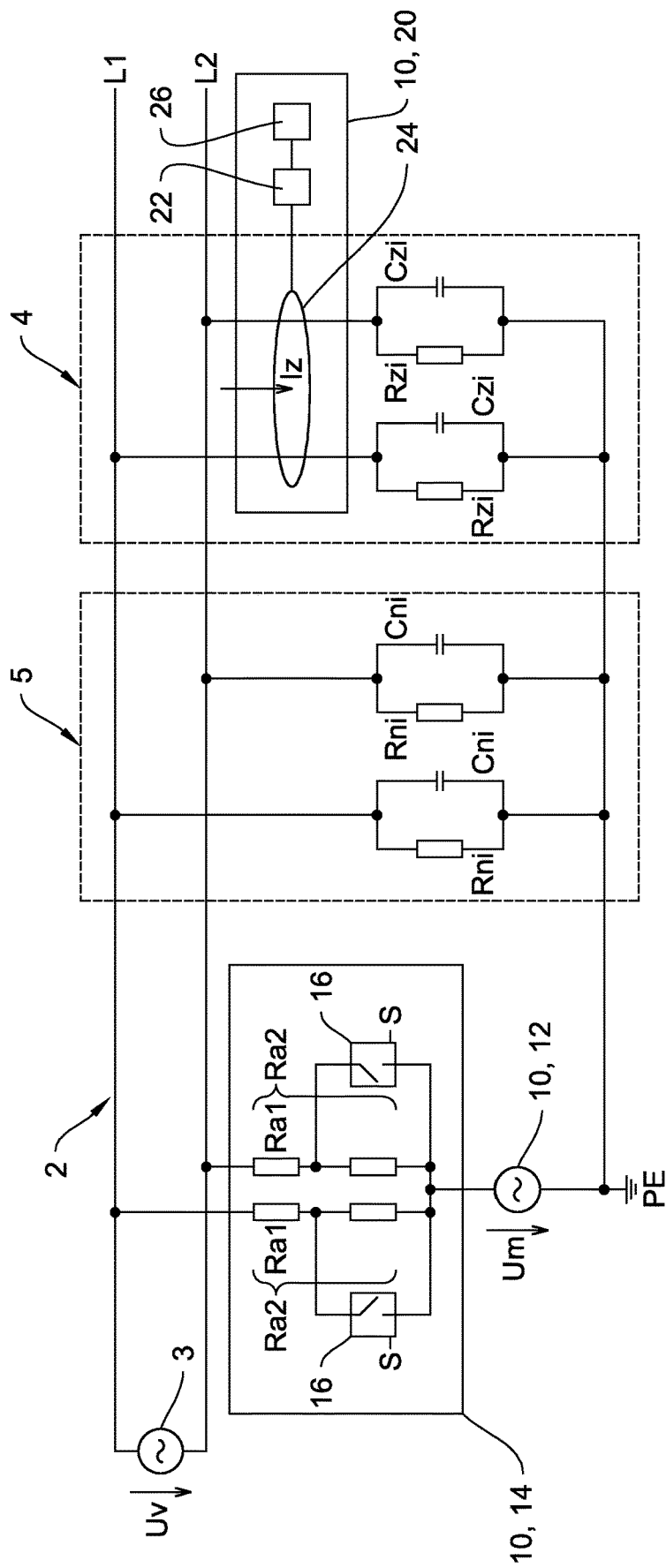
FIG. 1 shows a branched, ungrounded power supply system having an electric circuit arrangement according to the invention.

FIG. 1 shows a branched, ungrounded power supply system 2 having an electric circuit arrangement 10 according to the invention. Electric circuit arrangement 10 is shown exemplarily in the application environment of a single-phase, ungrounded alternating-voltage power supply system 2 (not part of the invention) having active conductors L1 and L2. Likewise, branched, ungrounded power supply system 2 can be, as another application environment, a multiphase alternating-voltage power supply system or a direct-voltage power supply system.

In the illustration, power supply system 2 is divided into a line branch 4 to be monitored and into a remaining power supply system 5 (main system having other line branches without monitored line branch 4).

Each active conductor L1, L2 of line branch 4 to be monitored has a partial insulation resistance Rzi and a partial leakage capacitance Czi to ground PE.

Remaining power supply system 5 has partial insulation resistance Rni and partial leakage capacitances Cni to ground PE.

Power supply system 2 is fed by a power source 3 having feeding voltage Uv.

Circuit arrangement 10 according to the invention consists of a controllable measuring voltage source 12 and a coupling circuit 14, which subjects power supply system 2 to a measuring voltage Um at a central location, and of a current sensor 20 disposed in line branch 4 to be monitored.

Coupling circuit 14 is configured to be switchable by means of a switch unit 16—shown here in a symmetrical coupling separate for each active conductor L1, L2—so that either a first coupling resistance Ra1 or a second coupling resistance Ra2 can be switched synchronously on active conductors L1, L2 when controlling switch unit 16 via a control line S. In this exemplary embodiment, second coupling resistance Ra2 is formed by a series connection (total formation) of first coupling resistance Ra1 having another resistance.

In line branch 4 to be monitored, a current sensor 20 is disposed, which registers and evaluates residual current Iz proportional to measuring voltage Um. For this purpose, current sensor 20 has a computing unit 22 and a data storage 26. Preferably, current sensor 20 is formed as a measuring current transformer 24 (current transformer having a toroid).

Figure 2:
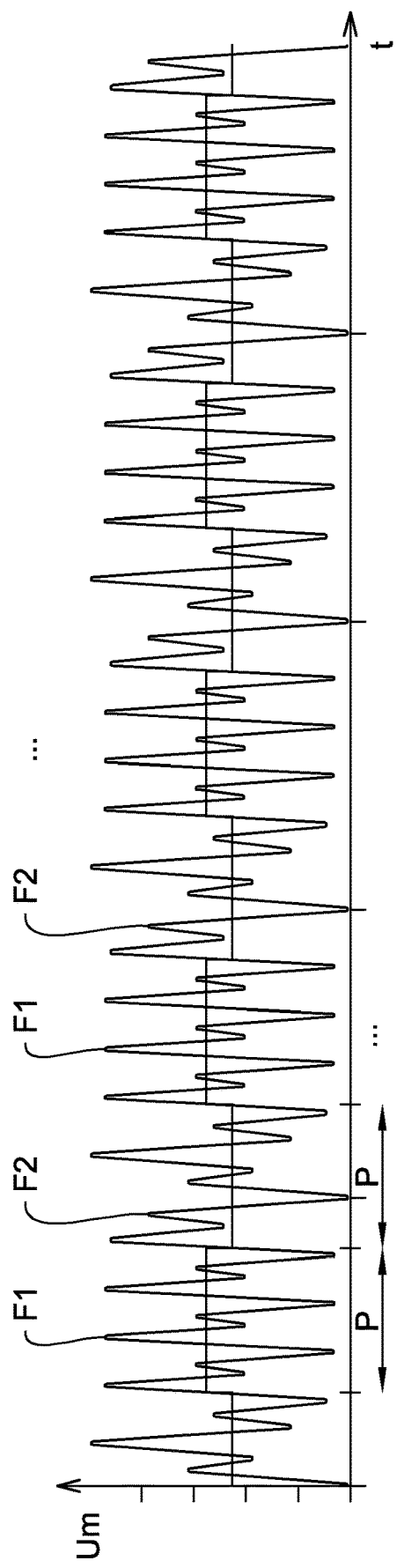
FIG. 2 shows a shape of the measuring voltage.

FIG. 2 shows a shape of measuring voltage Um.

Alternatingly over a generator period P, first frequency composition F1 and, in a subsequent generator period P, second frequency composition F2 are generated, generated first frequency composition F1 and second frequency composition F2 being fed centrally in power supply system 2 via first coupling resistance Ra1 and second coupling resistance Ra2, respectively.

Exemplarily, first frequency composition F1 and second frequency composition F2 are each superposed from two frequency portions, first frequency composition F1 differing from second frequency composition F2 in at least one frequency.

The periods of the frequency contained in frequency compositions F1 and F2 are chosen such that they fit in a generator period P as an integral multiple. Measuring voltage Um is coupled to power supply system 2 in the form of first frequency composition F1 for the duration of generator period P via first coupling resistance Ra1. After this generator period P has ended, switch unit 16 switches to the value of second coupling resistance Ra2, and frequency composition F2 is applied for the duration of subsequent generator period P as measuring voltage Um.

The duration of generator period P is advantageously adjusted to the network parameter of power supply system 2 (total insulation resistance, total leakage capacitance), the periods of the frequencies contained in frequency composition F1 and F2 being able to be scaled accordingly.

Residual current Iz registered by current sensor 20 in line branch 4 to be monitored is evaluated in conjunction with data storage 26. For this purpose, computing unit 22 executes a frequency analysis of residual current Iz, for example based on a Fourier transformation, over two subsequent generator periods P in order to determine which frequency composition F1, F2 is presently suppled during corresponding generator period P. The presently switched coupling resistance—first coupling resistance Ra1 or second coupling resistance Ra2—is thus detected from the assignment of known frequency composition F1, F2 known from current sensor 20 to corresponding coupling resistance Ra1, Ra2.

Figure 3:
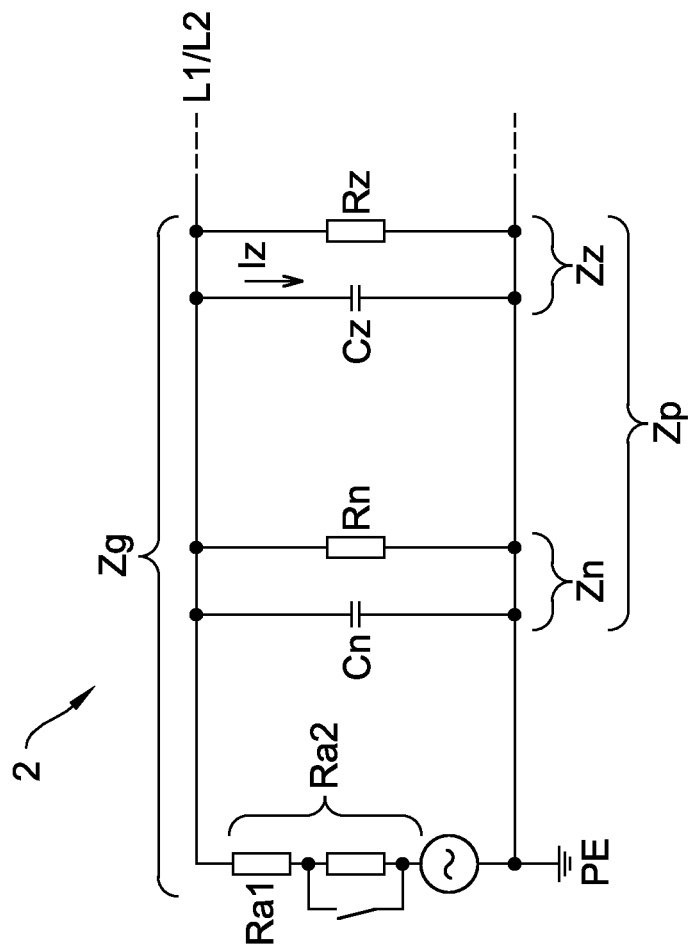
FIG. 3 shows an equivalent circuit diagram for computing the branch insulation resistance and the branch leakage capacitance.

FIG. 3 shows an equivalent circuit diagram for computing branch insulation resistance Rz and branch leakage capacitance Cz.

For this purpose, partial insulation resistances Rzi and partial leakage capacitances Czi of individual active conductors L1, L2 of line branch 4 to be monitored shown in FIG. 1 are summarized to a branch insulation resistance Rz and a branch leakage capacitance Cz in a simplified manner. Analogously, partial insulation resistance Rni and partial leakage capacitance Cni of remaining power supply system 5 are summarized to remaining insulation resistance Rn and remaining leakage capacitance Cn and the coupling resistances.

Complex resistance (impedance) Zz of line branch 4 to be monitored is derived from the parallel circuit of branch insulation resistance Rz and branch leakage capacitance Cz.

Likewise, impedance Zn of remaining power supply system 5 is derived from the parallel circuit of remaining insulation resistance Rn and remaining leakage capacitance Cn.

With the laws applicable in linear networks and by applying Kirchhoff's laws, a system of equations can be established for the four unknown variables remaining insulation resistance Rn, branch insulation resistance Rz and for remaining leakage capacitance Cn and branch leakage capacitance Cz. For this purpose, residual current Iz is measured by current sensor 20, whereas measuring voltage Um, their frequency composition and corresponding, actively switched first and second coupling resistance Ra1, Ra2 are known.

This system of equations is solvable with four combinations, made up of first coupling resistance Ra1, second coupling resistance Ra2 and two known frequencies $\omega 1$, $\omega 2$ contained in frequency compositions F1, F2.

In order to obtain a reliable assignment of frequency compositions F1, F2 to coupling resistance Ra1, Ra2, it can be advantageous to employ more than the two required frequencies $\omega 1$, $\omega 2$.

The variables remaining insulation resistance Rn and remaining leakage capacitance Cn and in particular wanted branch insulation resistance Rz and wanted branch leakage capacitance Cz can be detected analytically from the system of equations.

The invention claimed is:

1. A method for determining a branch insulation resistance (Rz) and a branch leakage capacitance (Cz) of a line branch (4) to be monitored in a branched, ungrounded power supply system (2) having active conductors (L1, L2), the method comprising the following steps:
generating a measuring voltage (Um) by means of a controllable measuring voltage source (12);
feeding the measuring voltage (Um) in each active conductor (L1, L2) at a central location of the power supply system (2) by means of a coupling circuit (14);
registering, by means of a current sensor (20), a residual current (Iz) caused by the measuring voltage (Um) in the line branch (4) to be monitored, characterized in that
the measuring voltage (Um) is formed alternatingly a generator period (P) from a first frequency composition (F1) and a second frequency composition (F2), respectively,
the first frequency composition (F1) is fed via a first coupling resistance (Ra1) by means of the coupling circuit (14) switchable using a switching unit (16) and the second frequency composition (F2) is fed via a second coupling resistance (Ra2);
the value of the first coupling resistance (Ra1) and the value of the second coupling resistance (Ra2) and the spectral composition of the first frequency composition (F1) and the spectral composition of the second frequency composition (F2) are stored in a data storage (26) of the current sensor (20);
the current sensor (20) executes a frequency analysis of the residual current (Iz) in a computing unit (22) over two subsequent generator periods (P) in order to identify which frequency composition (F1, F2) is fed presently;
the coupling resistance (Ra1, Ra2) presently switched is determined from the assignment of the identified frequency composition (F1, F2) to the corresponding coupling resistance (Ra1, Ra2) in the computing unit (22);
the branch insulation resistance (Rz) and the branch leakage capacitance (Cz) are computed in the computing unit from the measured residual current (Iz), the measuring voltage (Um), the frequencies contained in the frequency composition (F1, F2), and the coupling resistance (Ra1, Ra2).

2. The method according to claim 1, wherein the first frequency composition (F1) and the second frequency composition (F2) each contain at least two frequencies ($\omega 1$, $\omega 2$), the first frequency composition (F1) differing from the second frequency composition (F2) in at least one frequency.

3. The method according to claim 1, wherein the frequencies contained in the frequency compositions (F1, F2) are chosen such that their periods are contained as integral multiples in the generator period (P).

4. The method according to claim 1, wherein the measuring voltage (Um) is a test-pulse voltage of an insulation monitoring device or a test voltage of an insulation fault location device.

5. The method according to claim 1, wherein the residual current (Iz) is registered by means of a current sensor configured as a measuring-current transformer.

6. An electric circuit arrangement (10) for determining a branch insulation resistance (Rz) and a branch leakage capacitance (Cz) of a line branch to be monitored (4) in a branched, ungrounded power supply system (2) having active conductors (L1, L2), the circuit arrangement comprising a controllable measuring voltage source (12) for generating a measuring voltage (Um),
a coupling circuit (14) for feeding the measuring voltage (Um) in each of the active conductors (L1, L2) at a central location of the power supply system (2), a current sensor (20) for registering a residual current caused by the measuring voltage (Um) in the line branch (4) to be monitored, wherein the controllable measuring voltage source (12) is configured for alternatingly forming the measuring voltage (Um) having a first frequency composition (F1) and having a second frequency composition (F2) over a generator period (P),
the coupling circuit (14) is designed to be switchable by means of switch unit (16) and has a first coupling resistance (Ra1) for supplying the first frequency composition (F1) and a second coupling resistance (Ra2) for supplying the second frequency composition (F2),
the current sensor (20) has a data storage (26), in which the value of the first coupling resistance (Ra1) and the value of the second coupling resistance (Ra2) and the spectral composition of the first frequency composition (F1) and the spectral composition of the second frequency composition (F2) are stored,
the current sensor (20) has a computing unit (22), which is configured to execute a frequency analysis of the residual current (Iz) over two subsequent generator periods (P) in order to identify which frequency composition (F1, F2) is presently fed,
to determine the presently switched coupling resistance (Ra1, Ra2) from the assignment of the identified frequency composition (F1, F2) to the corresponding coupling resistance (Ra1, Ra2), and
to compute the branch insulation resistance (Rz) and the branch leakage capacitance (Cz) from the measured residual current (Iz), the measuring voltage (Um), the frequencies ($\omega 1$, $\omega 2$) contained in the frequency composition (F1, F2) and the coupling resistance (Ra1, Ra2).

7. The electric circuit arrangement (10) according to claim 6, wherein the controllable measuring voltage source (12) is configured such that the first frequency composition (F1) and the second frequency composition (F2) each contain at least two frequencies, the first frequency composition (F1) differing from the second frequency composition (F2) in at least one frequency.

8. The electric circuit arrangement (10) according to claim 6,
wherein the controllable measuring voltage source is configured such that the frequencies contained in the frequency compositions (F1, F2) are chosen such that their periods are contained as integral multiples in the generator period (P).

9. The electric circuit arrangement (10) according to claim 6,
wherein the controllable measuring voltage source (12) is a test-pulse voltage source of an insulation monitoring device or a test voltage source of an insulation-fault location device.

10. The electric circuit arrangement according to claim 6, wherein the current sensor (20) is designed as a measuring current transformer (24).

\* \* \* \* \*